(12) United States Patent
Fischer

(10) Patent No.: US 6,784,728 B2
(45) Date of Patent: Aug. 31, 2004

(54) LOW NOISE SWITCHED LOW PASS FILTER WITH BENIGN TRANSIENTS

(75) Inventor: Gerald R. Fischer, Playa Del Rey, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/209,379

(22) Filed: Jul. 31, 2002

(65) Prior Publication Data
US 2004/0021507 A1 Feb. 5, 2004

(51) Int. Cl.⁷ .................................................. H04B 1/10
(52) U.S. Cl. ........................................ 327/554; 327/555
(58) Field of Search ................................ 327/553, 554, 327/555, 558

(56) References Cited

U.S. PATENT DOCUMENTS

| 3,755,750 | A | * | 8/1973 | Heberling | 327/558 |
| 4,739,189 | A | * | 4/1988 | Kellogg | 327/555 |
| 4,752,749 | A | | 6/1988 | Moger | |
| 4,847,523 | A | * | 7/1989 | Schneider | 327/39 |
| 5,461,344 | A | | 10/1995 | Andoh | |
| 5,463,346 | A | * | 10/1995 | Brooks | 327/553 |
| 5,999,042 | A | * | 12/1999 | Hemdal et al. | 327/554 |
| 6,304,135 | B1 | * | 10/2001 | Muza | 327/553 |
| 6,380,800 | B1 | * | 4/2002 | Huber | 327/552 |
| 6,420,927 | B1 | * | 7/2002 | Tavares et al. | 327/554 |
| 6,452,443 | B1 | * | 9/2002 | Thompson et al. | 327/553 |
| 6,628,163 | B2 | * | 9/2003 | Dathe et al. | 327/553 |

FOREIGN PATENT DOCUMENTS

DE 19611219 A1 9/1997

* cited by examiner

Primary Examiner—Terry D. Cunningham
(74) Attorney, Agent, or Firm—Posz & Bethards, PLC

(57) ABSTRACT

A switched low pass filter (18) minimizes transients generated during filter switching events and eliminates active circuit random noise. The switched low pass filter (18) includes a filter input terminal (26) for receiving an input base band signal, and an RC circuit (R1, C1, S1, S2) for receiving the input base band signal and for passing only a filtered portion of the input base band signal depending on a wide, mid or narrow band mode of filter operation. The switched low pass filter (18) also includes a transient reduction circuit (34) in switchable communication with the RC circuit (R1, C1, S1, S2) for minimizing transients and switching events caused by transitioning to the mid and narrow band modes of filter operation.

21 Claims, 2 Drawing Sheets

LOW NOISE SWITCHED LOW PASS FILTER WITH BENIGN TRANSIENTS

CROSS-REFERENCE TO RELATED APPLICATION

This application is related to co-pending application Ser. No. 10/001,714 filed Oct. 24, 2001, entitled: "Phase Locked Loop with Charge Injection Cancellation," by the same inventor.

FIELD OF THE INVENTION

This invention relates generally to analog low pass filters, and particularly to a filter that reduces switching events when the filter is switched in and out of a phase locked loop.

BACKGROUND OF THE INVENTION

Conventional control systems such as phase locked loops used, for example, for frequency synthesis, often require a low pass filter in the forward path of the loop to suppress undesired circuit noise before the phased lock loop signal reaches the voltage controlled element. If the system has a high bandwidth, high-speed acquisition mode, the filter must be switched out of the signal path to avoid instability during signal acquisition. In a subsequent steady state narrow band mode, the filter must be switched back into the signal path after signal acquisition.

However, spurious transients are introduced when the filter is switched back into the signal path. The resulting partial reacquisition by the filter and the system of the signal thereby reduces the overall benefit of the acquisition mode. The spurious transients become even more problematic when they vary, as it is difficult to compensate for the varying transients. Further, the switching circuits and other elements of the filter often add unwanted active circuit random noise in the narrow bandwidth mode, thereby reducing the originally intended noise suppression benefits of the acquisition mode.

Therefore, it is an object of the present invention to provide a low pass filter that can be switched in and out of a control system in a manner that minimizes the effects of switching transients.

It is a further object of the present invention to provide a low pass filter for switching in and out of a control system in a manner that minimizes the effects of switching transients by producing a known consistent transient that allows for compensation.

It is a further object of the present invention to provide a low pass filter for switching in and out of a control system in a manner that minimizes unwanted active circuit random noise in the narrow band mode of operation.

BRIEF SUMMARY OF THE INVENTION

In view of the above, the present invention provides a switched low pass filter that minimizes transients generated during filter switching events and that does not add active circuit random noise. The switched low pass filter includes a filter input terminal for receiving an input base band signal, an RC circuit for passing only a filtered portion of the input base band signal depending on a wide, mid or narrow band mode of filter operation, and an output terminal to connect to a following controlled element.

The switched low pass filter also includes a transient reduction circuit in switchable communication with the RC circuit for minimizing transients and switching events caused by transitioning to the mid and narrow band modes of filter operation, and a filter output terminal for outputting the input base band signal in the wide band mode of operation and the filtered portion of the base band signal subsequent to the transient reduction circuit minimizing the transients and the switching events caused by transitioning to the mid and narrow band modes of filter operation.

DETAILED DESCRIPTION OF THE INVENTION

Figure 1:
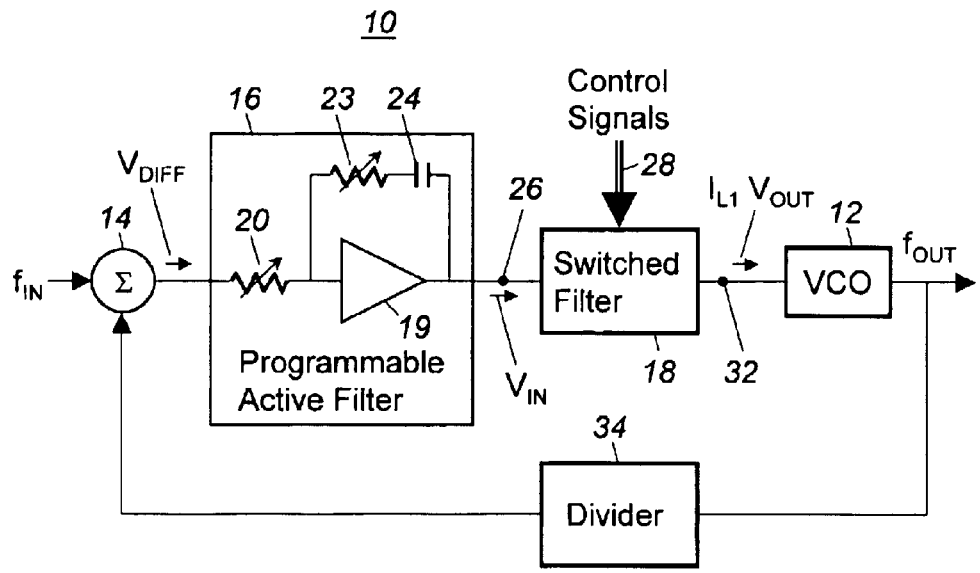
FIG. 1 is a circuit schematic diagram of a phase locked loop circuit including a switched low pass filter according to a preferred embodiment of the present invention.

Referring now to the drawings in which like numerals reference like parts, FIG. 1 shows a phase locked loop circuit (PLL) 10 of the type used for frequency synthesis purposes in connection with a voltage controlled element, represented generally as a voltage controlled oscillator (VCO), 12. The PLL 10 includes a phase detector 14 for creating a low frequency, or base band, voltage $V_{DIFF}$ indicative of the phase difference between the input signal $f_{IN}$ and a high frequency VCO output signal $f_{OUT}$. Both a programmable active filter 16 and a switched low pass filter 18 then filter the differential voltage signal $V_{DIFF}$ before the differential voltage signal $V_{DIFF}$ is input into the VCO 12 to tune the VCO 12 to the desired high frequency VCO output signal $f_{OUT}$.

The programmable active filter 16 is for setting the bandwidth of the PLL 10 according to well-known predetermined circuit-operating parameters, and may be constructed using an operational amplifier 19 with potentiometers 20, 23 and a capacitor 24 that are for adjusting the bandwidth of the programmable active filter 16. However, because the operational amplifier 19 and the phase detector 14 are active elements, they introduce signal noise that is output from the programmable active filter 16 along with an active filter voltage $V_{IN}$ that is input to the switched low pass filter 18 at the filter input 26.

The switched low pass filter 18 of the type according to a preferred embodiment of the present invention is for protecting the VCO 12 from the noise generated by the operational amplifier 19 and the phase detector 14. The switched low pass filter 18 is switched into and out of the PLL 10 based on control signals that are input from a command system such as, for example, a microprocessor to a control signal line 28 and that correspond to the operating parameters and modes of the programmable active filter 16. As will be discussed below in detail, the switched low pass filter 18 filters noise introduced to the input voltage $V_{IN}$ by the active elements of the programmable active filter 16 and the phase detector 14 as well as transients introduced by switching elements in the switched low pass filter 18 itself in a manner that ensures that it accommodates passage of a desired output signal, including a desired voltage $V_{OUT}$ and a small, non-zero load current $I_{LOAD}$, from its output terminal 32 to the VCO 12.

Figure 2:
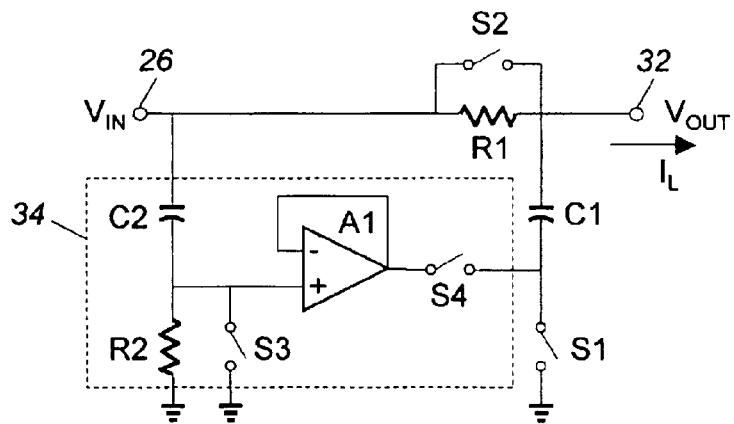
FIG. 2 is a circuit schematic diagram of the switched low pass filter of FIG. 1 in more detail.

FIG. 2 shows the switched low pass filter 18 in more detail. In the switched low pass filter 18, an RC circuit includes a resistor R1 and a capacitor C1 of the type present in any conventional low pass filter for producing at the output terminal 32 an output voltage $V_{OUT}$ in response to the input voltage $V_{IN}$. In addition, the switched low pass filter 18 includes switches S1, S2, both of which are preferably FET switches of the type included in conventional switched low pass filters. The switch S1 is coupled between the capacitor C1 and ground, and the switch S2 is coupled in parallel with the resistor R1. In addition, the switched low pass filter 18 includes a transient reduction circuit 34 that enables the switched low pass filter 18 to transition from a wide band, or acquisition, mode to a mid band mode and then to a narrow band, or steady state, mode in a manner that minimizes the effects of transients and noise, or switching events, introduced by the switches S1, S2 during the transition. More specifically, the transient reduction circuit 34 can be manipulated during wide band, mid band and narrow band modes of filter operation to enable the switched low pass filter 18 to arrive at a steady state current and voltage mode without the varying, and therefore unpredictable, transients generated by the switches S1, S2 that are problematic in conventional switched low pass filters.

The transient reduction circuit 34 includes a capacitor C2 and a resistor R2 coupled between the filter input 26 and ground, with the resistor R2 providing a charging path for the capacitor C2 when the switched low pass filter 18 operates in a mid band mode of operation. An amplifier A1 such as, for example, a buffer amplifier with unity gain, has its positive input terminal coupled to the capacitor C2 and the resistor R2 and is used to for impedance isolation purposes. In addition, a switch S3 is coupled at one end to the positive input terminal of the amplifier A1 and at its other end to ground, and a switch S4 is coupled between an output terminal of the amplifier A1 and between the capacitor C1 and the switch S1. As will be described now in more detail, the transient reduction circuit 34 enables the switched low pass filter 18, and particularly the resistor R1, the capacitor C1 and the switches S1, S2, to produce a filtered output signal with low noise and benign transients when driven by a relatively low impedance source such as an operational amplifier in the programmable active filter 16 and when used in conjunction with a high impedance load such as the VCO 12.

Values for the above elements of the switched low pass filter 18 such as the resistors R1, R2 and the capacitors C1, C2 may vary according to the particular control system loop in which the switched low pass filter 18 is implemented. When, for example, the output terminal of the switched low pass filter 18 is coupled to an input terminal of the VCO 12, the bandwidth of the PLL 10 may have an exemplary value of 100 KHz during acquisition and 10 KHz during steady state, and therefore the filter elements may have values of, for example, R1=750 Ω, C1=2000 pF, C2=700 pF and R2=2500 Ω. The resulting switched low pass filter has a bandwidth of several MHz in the wide band mode and 100 KHz in the narrow band mode. An operational amplifier such as, for example, an OP-37 for the operational amplifier A1 with power supplies of ±10V can accommodate VCO voltages within this range and load currents greater than 10 mA.

Still referring to FIG. 2, operation of the switched low pass filter 18 will now be described first assuming that the transient reduction circuit 34 is inoperative, that the switch S2 at all times remains open so that the switched low pass filter 18 operates like a first type of conventional switched low pass filter, and that the switched low pass filter 18 is driven by a relatively low impedance source and is driving a relatively high impedance load. Under such a scenario, when there is a switching from a steady state operating point, a change in the operating voltage $V_{IN}$ occurs. When, for example, the PLL 10 in FIG. 1 is commanded to acquire a new operating frequency, control signals from the control line 28 cause the switch S1 to open to transition the switched low pass filter 18 to a wide band mode. In this wide band mode, the operating voltage $V_{OUT}$ rapidly transitions to the new operating voltage $V_{IN}$. However, when the switch S1 is subsequently closed to change the operation of the switched low pass filter 18 to a narrow band mode of operation, the new output voltage $V_{OUT}$ cannot follow the input voltage $V_{IN}$ quickly because the capacitor C1 must first charge to the input voltage $V_{IN}$. Therefore, initially there is not sufficient current $((V_{OUT}-V_{IN})/R1)$ across the capacitor C1 when the switch S1 is closed. As a result, a lengthy reacquisition process is required in the narrow band mode to bring the voltage of the capacitor C1 to its new required value of $V_{IN}$.

Still referring to FIG. 2, operation of the switched low pass filter 18 will next be described assuming that the transient reduction circuit 34 is inoperative, that the switch S1 at all times remains open so that the switched low pass filter 18 operates like a second type of conventional switched low pass filter, and that the switched low pass filter 18 is driven by a relatively low impedance source and is driving a relatively high impedance load. Under such a scenario, when the PLL 10 is commanded to acquire a new frequency and there is a change in the operating voltage $V_{IN}$, control signals from the control line 28 cause the switch S2 to close to enable the switched low pass filter 18 to operate in a wide band mode. Therefore, almost all current bypasses the resistor R1 when the value of R1 is relatively large, and therefore the voltage $V_{OUT}$ rapidly follows the voltage $V_{IN}$. When the switch S2 is opened to switch the switched low pass filter 18 to a narrow band mode of operation, all current must pass through the resistor R1. However, as the load impedance at the output terminal 32 of the switched low pass filter 18 (the input terminal of the VCO 12 in FIG. 1) draws current through the resistor R1, the opening of the switch S2 introduces a transient that requires a long reacquisition period at the capacitor C1 as in the first scenario. This transient also is dependent on, and therefore varies with, the load current and therefore the operating voltage (the specific tuned frequency of the VCO 12) at that time. Therefore, it is difficult to compensate for the transient.

Figure 3:
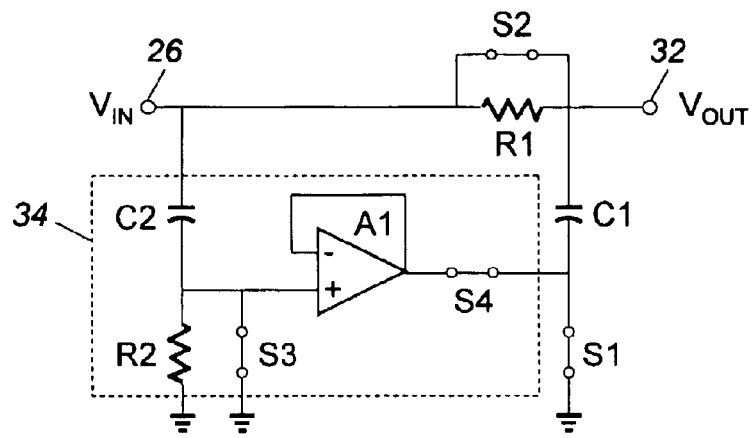
FIG. 3 is a circuit schematic diagram of the switched low pass filter of FIG. 1 in wide band signal acquisition mode.
Figure 4:
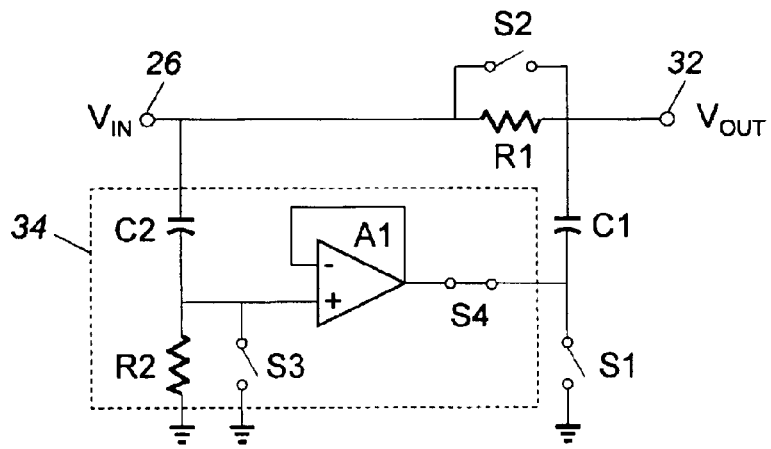
FIG. 4 is a circuit schematic diagram of the switched low pass filter of FIG. 1 in mid band mode.
Figure 5:
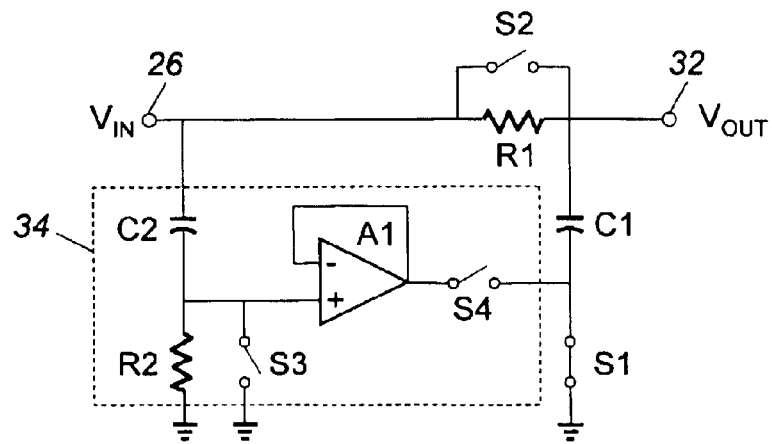
FIG. 5 is a circuit schematic diagram of the switched low pass filter of FIG. 1 in narrow band steady state mode.

Referring now to FIGS. 3–5, operation of the switched low pass filter 18, including the transient reduction circuit 34, according to the present invention will now be described in a manner that will make it clear to one skilled in the art how the above limitations associated with conventional switched low pass filters are overcome. In FIG. 3, when the PLL 10 is commanded to acquire a new frequency and there is a switching from a steady state operating point at the filter output terminal 32, there is a change in the input voltage $V_{IN}$ at the filter input 26. Control signals input on the control line 28 close the switches S1–S4 to enable the switched low pass filter 18 to operate in a wide band mode to enable the output voltage $V_{OUT}$ to rapidly transition to the new input voltage $V_{IN}$, as is necessary in high speed acquisition of a new frequency in the PLL 10. The switched low pass filter 18 has a resulting high bandwidth value limited only by the respective parasitic resistances of the switches S1–S4. The capacitor C2 is charged to the input voltage $V_{IN}$. The capacitor C1 is charged to the final narrow band mode voltage value during this wide band mode of operation.

FIG. 4 illustrates the configuration of the switched low pass filter 18 during operation in a mid band mode, which is a transitional mode of operation that prepares the switched filter for transition to a narrow band mode of operation. To manipulate the switched low pass filter 18 to the mid band mode, control signals from the control line 28 (FIG. 1) simultaneously open the switches S1, S2 and S3 to provide the switched low pass filter 18 with a high bandwidth frequency while maintaining the proper charge on the capacitor C1. Put another way, although the switch S2 is open and the switched low pass filter 18 appears to be a low pass filter with a corner frequency dependent on the values of the resistor R1 and the capacitor C1, the signal path through the capacitor C2 and the amplifier A1 to the capacitor C1 provides a zero that is almost identical to the pole provided by the resistor R1 and the capacitor C1. Consequently, a small amount of amplitude and phase distortion results in the region of the pole zero pair and is tolerated by the PLL 10.

During the mid band mode of operation, the switched low pass filter 18 completes the pre-charging of the capacitors C1, C2. The pre-charging of the capacitors C1, C2 accounts for any voltage drop across the resistor R1 that might appear as filter load impedance. At the beginning of the medium band mode, the capacitor C2 is charged to a voltage that is nearly identical to that of the capacitor C1 because the switch S1 is closed. When the switch S1 is opened, a voltage begins to appear across the resistor R1 due to the load current. The PLL 10 responds by providing a compensating voltage change at the filter input to hold the filter output constant to remain at the correct frequency lock point. The capacitor C2 correspondingly charges to the new voltage through the resistor R2, thereby keeping the voltage at the bottom of the capacitor C1 equal to zero and thus maintaining the proper charge on C1. The time constant formed by the resistor R2 and the capacitor C2 is sufficiently fast to resolve the small voltage change in a short amount of time compared to the resulting amount of time if the PLL 10 was forced to accommodate this change in the following narrow band mode. As a result, the switched low pass filter 18 is capable of driving a load such as the VCO 12 (FIG. 1) that has a load current that varies as a function of operating voltage or temperature. In addition, the mid band mode of operation enables the switched low pass filter 18 to accommodate the transient charge injection from the switches S1 and S3, which can prove to be problematic if they remain present upon the transition of the switched low pass filter 18 to a narrow band mode of operation, as the transient charge injection can vary as a function of switch operating voltage.

FIG. 5 illustrates the configuration of the switched filter 18 during operation in a narrow band, or steady state, mode. To manipulate the switched low pass filter 18 to the narrow band mode, the switch S4 is opened and the switch S1 is closed by the control signals from the control line 28 in FIG. 1. Preferably, the switch S1 is closed slightly before the switch S4 is opened so that any parasitic charge injection caused by the closing of the switch S1 flows through the relatively low impedance switch S4 into the output terminal of the amplifier A1.

The transition into the narrow band mode creates only one significant transient, which is the change in the voltage charge of the capacitor C1 due to the offset of the amplifier A1 relative to the zero offset of the switch S1. However, this transient can be minimized through selection of the proper amplifier. In addition, because this transient is a constant transient, it can be compensated for by, for example, feeding an offset voltage corresponding to the response of the PLL 10 back to the positive input terminal of the amplifier A1. Finally, because the amplifier A1 is disconnected during the narrow band mode of operation, active circuit random noise is effectively eliminated.

In view of the above, it should be appreciated that the switched low pass filter 18 of the present invention provides for the implementation of a complex bandwidth switched PLL with lower reacquisition and lower random noise in the final narrow band mode of operation than would otherwise be possible. The switched low pass filter 18 is switched in a manner that is unique because the switching only generates small and predictable transient disturbances even when the operating signal voltage and current vary significantly. While the switched low pass filter 18 has been described in the context of a phase locked loop and for driving a VCO, the switched low pass filter 18 is capable of being used in any control system loop requiring a switched low pass filter to accommodate wide band and narrow band control system modes.

While the above description is of the preferred embodiment of the present invention, it should be appreciated that the invention may be modified, altered, or varied without deviating from the scope and fair meaning of the following claims.

What is claimed is:

1. A switched low pass filter comprising:
    a filter input terminal for the receiving an input base band signal;
    an RC circuit for receiving the input base band signal and for passing only a filtered portion of the input base band signal depending on a wide, mid or narrow band mode of filter operation;
    a transient reduction circuit including an active circuit element, the transient reduction circuit in switchable communication with the RC circuit for minimizing transients and switching events caused by transforming to the mid and narrow band modes of filter operation, and for eliminating active circuit random noise by disconnecting an output of the active circuit element from the RC circuit during the narrow band mode of operation; and
    a filter output terminal for outputting the input base band signal in the wide band mode of operation, and the filtered portion of the base band signal subsequent to the transient reduction circuit minimizing the transients and the switching events caused by transitioning to the mid and narrow band modes of filter operation.

2. The switched low pass filter of claim 1, wherein the RC circuit comprises: an RC circuit resistor and an RC circuit capacitor, a first switch coupled in parallel with the RC circuit resistor, and a second switch coupled between the RC circuit capacitor and ground.

3. The switched low pass filter of claim 2, wherein the transient reduction circuit is further for charging the RC circuit capacitor during the wide and mid band modes of filter operation.

4. The switched tow pass filler of claim 2, wherein the transient reduction circuit comprises;
    a transient reduction circuit capacitor and a transient reduction circuit resistor coupled between the filter input terminal end ground, the transient reduction circuit resistor for providing a charging path for the transient reduction circuit capacitor during the wide and mid hand modes of filter operation;
    a unity gain amplifier comprising the active having a positive input amplifier terminal coupled between the transient reduction circuit capacitor and the transient reduction circuit resistor, and an amplifier output terminal coupled between the RC circuit capacitor and the first switch for providing impedance isolation between the transient reduction circuit capacitor and the RC circuit capacitor;

a third switch coupled between the positive input terminal of the unity gain amplifier and ground; and a fourth switch coupled to the output terminal of the unity gain amplifier and between the RC circuit capacitor and the first switch.

5. The switched low pass filter of claim 4, wherein during the wide band mode of filter operation, the first, second, third and fourth switches are closed, and the transient reduction circuit capacitor is for charging the RC circuit capacitor through the unity gain amplifier.

6. The switched low pass filter of claim 5, wherein during the mid band mode of filter operation, the first, second and third switches are simultaneously opened and the fourth switch remains closed to preserve a charge across the RC circuit capacitor from the wide band mode of operation.

7. The switched low pass filter of claim 6, wherein during the narrow band mode of filter operation, the fourth switch is opened and the first switch is closed to preserve the change across the RC circuit capacitor from the wide and mid band modes of operation.

8. The switched low pass filter of claim 6, wherein during the narrow band mode of filler operation, the unity gain amplifier compensates for a constant transient generated by a change in the charge across the RC capacitor due to an offset of the unity gain amplifier relative to a zero offset of the first switch by feeding a change in an offset voltage, corresponding to a system response to the constant transient, back to the positive input terminal of the unity gain amplifier via a servo loop to reduce an observed system response.

9. The switched low pass filter of claim 6, wherein during the narrow band mode of filter operation, tile third and fourth switches are opened to disconnect the unity gain amplifier from the RC circuit and to therefore eliminate the active circuit random noise at the filter output terminal.

10. The switched low pass filter of claim 6, wherein during the mid band mode of filler operation, a signal path through the transient reduction circuit capacitor and the unity gain amplifier to the RC circuit capacitor provides a zero almost identical to a pole provided by the RC circuit resistor and the RC circuit capacitor.

11. The switched low pass lifter of claim 4, wherein the first, second, third and fourth switches comprise FET switches.

12. The switched low pass filter of claim 1, wherein the transient reduction circuit is for accommodating passage of a small, non-zero load current from the filter input terminal to the fillet output terminal.

13. The switched low pass filter of claim 1, wherein the filter input terminal is connected to a low impedance source, and wherein the filter output terminal is connected to a high impedance load.

14. A switched low pass filler comprising:

an RC circuit for filtering an input be rid signal and including both an RC circuit resistor and an RC circuit capacitor;

a transient reduction circuit coupled to the RC circuit for switching the RC circuit to a wide band mode of operation to accommodate acquisition of a new input signal to charge the RC circuit capacitor, for subsequently switching the RC circuit to a mid band mode of operation to transition the circuit from the wide band mode of operation to maintain a charge on the RC circuit capacitor accumulated during the wide band mode of operation, and for subsequently switching the RC circuit to a narrow band steady state mode of operation, the transient reduction circuit thereby minimizing transients caused by switching the RC circuit to the mid and narrow band modes of operation, wherein the transient reduction circuit includes an active circuit element, and wherein the transient reduction circuit decouples and output of the active circuit element from the RC circuit when switching the RC circuit to the narrow band steady state mode of operation to thereby eliminate active circuit random noise.

15. The switched tow pass filter of claim 14, wherein:

the RC circuit further comprises a rater input terminal coupled to the RC circuit resistor, a filter output terminal coupled to both the RC circuit resistor and the RC circuit capacitor, a first switch coupled in parallel with the RC circuit resistor, and a second switch coupled between the RC circuit capacitor and ground; and the transient reduction circuit comprises:

a transient reduction circuit capacitor and a transient reduction circuit resistor coupled between the filter input terminal and ground, the transient reduction circuit resistor for providing a charging path for the transient reduction circuit capacitor during the wide and mid band modes of operation;

a unity gain amplifier comprising the active circuit element and having a positive input amplifier terminal coupled between the transient reduction circuit capacitor and the transient reduction circuit resistor, and an amplifier output terminal coupled between the RC circuit capacitor and the first switch for providing impedance isolation between the transient reduction circuit capacitor and the RC circuit capacitor;

a third switch occupied between the positive input terminal of the unity gain amplifier and ground, and a fourth switch coupled to the output terminal of the unity gain amplifier and between the RC circuit capacitor and the first switch.

16. The switched tow pass filter of claim 15, wherein the transient reduction circuit closes the first, second, third and fourth switches during the wide band mode of filter operation to enable the RC circuit capacitor to charge rapidly.

17. The switched low pass tutor of claim 16, wherein, the transient reduction circuit simultaneously opens the first, second and third switches during the mid band mode of filter operation to preserve a charge across the RC circuit capacitor developed during the wide band mode of operation.

18. The switched low pass filter of claim 17, wherein the transient reduction circuit closes the first switch and subsequently opens the fourth switch during the narrow band mode of filter operation to preserve the charge across the RC circuit capacitor developed during the wide end mid band modes of operation and to provide a narrow band low pass effect on the input base band signal.

19. The switched low pass filter of claim 17, wherein during the narrow band mode of filter operation, the unity gain amplifier compensates for a constant transient, generated by a change in the charge of the RC circuit capacitor due to an offset of the unity gain amplifier relative to a zero offset of the first switch, by feeding a change in an offset, voltage, corresponding to a system response to the transient, back to the positive input terminal of the unity gain amplifier via a servo loop to reduce an observed system response.

20. The switched low pass filter of claim 17, wherein the transient reduction circuit opens the fourth switch during the narrow hand mode of operation to therefore disconnect the unity gain amplifier and eliminate the active circuit random noise at the filter output terminal.

21. The switched low pass filter of claim 16, wherein during the mid band mode of filter operation, a signal path through the transient reduction circuit capacitor and the unity gain amplifier to the RC circuit capacitor provides a zero almost identical to a pole provided by the RC circuit resistor and the RC circuit capacitor.

* * * * *